United States Patent Office 3,625,730

Patented Dec. 7, 1971

3,625,730
CONDUCTIVE DESIGNS AND PROCESS FOR THEIR MANUFACTURE

Sung Ki Lee, Niagara Falls, N.Y., assignor to Hooker Chemical Corporation, Niagara Falls, N.Y.

No Drawing. Filed May 6, 1968, Ser. No. 727,045
Int. Cl. B44d *1/18;* H05k *1/00*
U.S. Cl. 117—38 16 Claims

ABSTRACT OF THE DISCLOSURE

Printed circuits, integrated circuits, resistors, thermocouples, condensers, superconductors, electroformed materials, and the like are produced by providing a plastic or substantially non-metallic substrate with a metal phosphide; applying a resist; removing the unprotected metal phosphide; dissolving the resist; and subjecting the substrate to electroless or electrolytic treatment.

BACKGROUND OF THE INVENTION

The use of printed apparatus or articles, such as circuits, resistors, condensers and the like in the electronic industry has become widespread in recent years. One of the major problems encountered in producing such electronic apparatus has been the lack of an inexpensive, precision metalizing process. It has also been difficult to provide firm adhesion between the metallic conductor and the substrate. Previous methods of producing designs on plastic or non-metallic substrates have required selective etching of a metal layer or a series of selective etchings, or involved many process steps. The term "design" as used herein, means predetermined areas of conductivity. Said designs may take the form of printed circuits, integrated circuits, resistors, special resistors, inductors, thermocouples, capacitors, semi and super conductors, condensers, special condensers, electron tubes, solid state apparatus, electroformed materials, and the like.

A new process for metalizing substrates is described in copending application Ser. No. 683,793, filed Nov. 17, 1967 and now abandoned. The present invention relates to the production of designs on plastic or substantially non-metallic substrates with said metalizing process.

Accordingly, it is an object of this invention to provide a process for the production of designs on plastic or substantially non-metallic substrates with the metalizing system of Ser. No. 683,793.

Another object of the invention is to provide a process whereby said design will be adherently bound to said plastic or substantially non-metallic substrate.

A further object is to provide a process capable of producing a vast number of design configurations, such as printed circuits, resistors, thermocouples, and the like.

Still further objectives will become apparent to those skilled in the art from the following disclosure.

SUMMARY OF THE INVENTION

This invention relates to designs on plastic or substantially non-metallic substrates and a novel process for their formation. More particularly, this invention relates to designs on plastic or susbtantially non-metalilc substrates in the form of printed circuits, integrated circuits, resistors, special resistors, inductors, thermocouples, capacitors, semi and super conductors, condensers, special condensers, electron tubes, solid state apparatus, electroformed materials, and the like, produced by a process which comprises providing said substrate with a metal phosphide; applying a resist; removing said metal phosphide from the unprotected areas; dissolving the resist, and subjecting the thus-treated substrate to electroless and/or electrolytic treatment.

DESCRIPTION OF THE PREFERRED EMBODIMENT

The first treatment step of the preferred process of this invention comprises providing a plastic or substantially non-conductive substrate with a metal phosphide by the process of Ser. No. 683,793. Briefly, this process comprises treating the substrate with elemental white phosphorus, which includes the various impure or commercial grades sometimes referred to as yellow phosphorus. The phosphorus can be utilized in the vapor phase, as a liquid or dissolved in a solvent.

Suitable solvents or diluents for the elemental phosphorus are solvents that dissolve elemental phosphorus and which preferably swell the surface of a plastic without detrimentally affecting the surface of the plastic. Such solvents include the halogenated hydrocarbons and halocarbons such as chloroform, methyl chloroform, trichloroethylene, perchloroethylene, ethyl dibromide and the like; aromatic hydrocarbons such as benzene, toluene, xylene and the like.

When a solution of phosphorus is employed, the concentration is generally in the range from about 0.0001 weight percent of phosphorus based on the weight of the solution up to a saturated solution, and preferably from about 1.5 to about 2.5 percent. The phosphorus treatment is generally conducted at a temperature below the softening point or decomposition point of the substrate, and below the boiling point of the solvent, if a solvent is used. Generally the temperature is in the range of about 30 to about 135 degrees centigrade, but preferably in the range of about 50 to about 100 degrees centigrade. The contact time varies depending on the nature of the substrate, the solvent and temperature, but is generally in the range of about one second to one hour or more, preferably of about one to ten minutes.

The process of Ser. No. 683,793 is applicable to substrates, such as plastics and to other substantially non-metallic substrates. Suitable substrates include, but are not limited to, cellulosic and ceramic materials such as cloth, paper, wood, cork, cardboard, clay, porcelain, leather, porous glass, asbestos cement, and the like. Semi conductive substrates such as polycrystalline silicon carbides and its derivatives, polycrystalline boron carbides and its derivatives, polycrystalline aluminum oxide and its derivatives, polycrystalline germanium and gallium and their derivatives, and the like can also be employed.

Typical plastic substrates include homopolymers and copolymers of ethylenically unsaturated aliphatic, alicyclic and aromatic hydrocarbons such as polyethylene, polypropylene, polybutene, ethylenepropylene copolymers; copolymers of ethylene or propylene with other olefins, polybutadiene; polymers of butadiene, polyisoprene, both natural and synthetic,polystyrene and polymers of pentene, hexene, heptene, octene, 2-methylpropene, 4-methylhexene-1, bicyclo-(2.2.1)-2-heptene, pentadiene, hexadiene, 2,3-dimethylbutadiene-1,3,4-vinylcyclohexene, cyclopentadiene, methylstyrene, and the like. Other polymers useful in the invention include polyindene, indene-coumarone resins; polymers of acrylate esters and polymers of methacrylate esters, acrylate and methacrylate resins such as ethylacrylate, n-butyl methacrylate, isbutyl methacrylate, ethyl methacrylate and methyl methacrylate; alkyd resins; cellulose derivatives such as cellulose acetate, cellulose acetate butyrate, cellulose nitrate, ethyl cellulose, hydroxyethyl cellulose, methyl cellulose and sodium carboxymethyl cellulose; epoxy resins; furan resins (furfuryl alcohol or furfural ketone); hydrocarbon resins from petroleum; isobutylene resins (polyisobutylene); isocyanate resins (polyurethanes); melamine resins such as melamine-formaldehyde and melamine-ureaformaldehyde; oleo-resins; phenolic resins such as phenol-formaldehyde, phenolic-elastomer, phenolic-epoxy, phenolic-polyamide, and phenolic-vinyl acetals; polyamide polymers, such as polyamides, polyamide-epoxy and particularly long chain synthetic polymeric amides containing recurring carbonamide groups as an integral part of the main polymer chain; polyester resins such as unsaturated polyesters of dibasic acids and dihydroxy compounds, and polyester elastomer and resorcinol resins such as resorcinol-formaldehyde, resorcinol-furfural, resorcinol-phenol-formaldehyde, resorcinol-polyamide and resorcinol-urea; rubbers such as natural rubber, synthetic polyisoprene, reclaimed rubber, chlorinated rubber, polybutadiene, cyclized rubber, butadiene-acrylonitrile rubber, butadiene-styrene rubber, and butyl rubber; neoprene rubber (polychloroprene); silicon elastomers; polysulfides (Thiokol); terpene resins; urea resins, vinyl resins such as polymers of vinyl acetal, vinyl acetate or vinyl alcohol-acetate copolymer, vinyl alcohol, vinyl chloride, vinyl butyral, vinyl chloride-acetate copolymer, vinyl pyrrolidone and vinylidene chloride copolymer; polyformaldehyde; polyphenylene oxide; polymers of diallyl phthalates and phthalates; phosgene; polycarbonates of phosgene or thiophosgene and dihydroxy compounds such as bisphenols, thermoplastic polymers of bisphenols and epichlorohydrin (trade named Phenoxy polymers); graft copolymers of polymers of unsaturated hydrocarbons and and unsaturated monomer, such as graft copolymers of polybutadiene, styrene and acrylonitrile, commonly called ABS resins; ABS-polyvinyl chloride polymers, recently introduced under the trade name of Cycovin; and acrylic polyvinyl chloride polymers, known by the trade name of Kodex 100.

The polymers can be used in the unfilled conditions, or with fillers such as glass fiber, glass powder, glass beads asbestos, talc or other mineral fillers, wood flour and other vegetable fillers, carbon in its various forms, dyes, pigments, waxes and the like.

The substrates can be in various physical forms, such as shaped articles, for example, moldings, sheets, rods, and the like; fibers, films and fabrics, and the like and of various thicknesses.

Following the phosphorus treatment, the substrate can be subjected to water and/or aqueous solution of a surfactant, as disclosed in my copending application Ser. No. 671,331, filed Sept. 28, 1967, now Pat. No. 3,508,754, and then dried by exposure to the atmosphere, inert atmospheres such as nitrogen or carbon dioxide, radiant heaters, or placed in a conventional oven. The rinsing and drying steps are optional.

The phosphorus-treated substrate is then contacted with a bath containing a solution of a metal salt or complex of a metal salt which is capable of reacting with the phosphorus to form a metal phosphide. The term metal phosphide, as used herein, means the metal-phosphorus which is formed at the surface of the substrate. The metals generally employed are those of Groups I–B, II–B, IV–B, V–B, VI–B, VII–B, and VIII of the Periodic Table. The preferred metals are copper, silver, gold, chromium, manganese, cobalt, nickel, palladium, titanium, zirconium, vanadium, tantalum, cadmium, tungsten, molybdenum, and the like. The bath can also contain a small amount of $OH^-$, $AlR_3H^-$, $BR_3H^-$, or mixtures thereof, wherein each R is individually selected from the group consisting of alkyl, aryl and hydrogen for low temperature operation as disclosed in my copending application, Ser. No. 694,122, filed Dec. 28, 1967.

The metal salts can contain a wide variety of anions. Suitable anions include sulfate, chlorate, nitrate, cyanide, chloride, and the like; formate, acetate, caprylate, palmitate and the like.

The metal salts can be complexed with a complexing agent that produces a solution having a basic pH (>7). Particularly useful are the ammoniacal complexes of the metal salts, in which one to six ammonia molecules are complexed with the foregoing metal salts. Other useful complexing agents include quinolines, amine and pyridines.

The foregoing metal salts and their complexes are used in ionic media, preferably in aqueous solutions. However, non-aqueous media can be employed. The solution concentration is generally in the range from about 0.1 weight percent metal salt or complex based on total weight of the solution up to a saturated solution.

The treated substrates can be subjected directly to the second treatment step of this invention or can be stored for later use.

The second treatment step of the preferred process comprises applying a resist on the areas of the substrate which are to be conductive in the printed apparatus. The resist is selected so that it will be impervious to the washing agent of the third treatment step described hereinbelow, and/or the electroless and/or electrolysis solutions if one of the alternative embodiments, described hereinafter, is employed. Any of the previously known resists can be employed and any method of application can be used. For example, resists including oil, cellulose, vinyl or natural resin based, and the like, can be applied by screening methods; resists such as fish glue, gum arabic, gelatic, albumen, shellac sensitized with ammonium dichromate, and the like can be applied by photomethods; inks reinforced with bituminous powder or dragon's blood, and the like, can be applied by offset painting; and the like.

The third treatment step of the preferred process comprises subjecting the printed substrate to a washing agent to remove the metal phosphide from the unprotected portion of the substrate. Said washing agent comprises any oxidizing media (either acidic or basic) Representative agents include the hypophosphates, ceric perchlorate, ceric nitrate, ceric sulfate, potassium permanganate, potassium dichromate, potassium bromate, potassium iodate, iodine-potassium iodide, potassium ferricyanide, ferric chloride, cupric chloride, ammonium persulfate, and the like; oxidizing mineral acids such as nitric, hydrochloric, hypochloric, phosphoric, periodic, sulfuric, chromic, and the like; peracids, peroxides, organic and inorganic ozonites such as $KO_3$, and the like. The preferred agents are nitric acid, in the form of an about 50 percent by volume water solution; 10 percent hypochloride acid by volume water solution; and 30 percent $H_2O_2$ by volume water solution. The removal of the metal phosphide can be accelerated by the addition of a metal which will go into solution with the washing agent. For example, copper sulfate can be employed with the 50% nitric acid; copper sulfate or cobalt chlorides can be employed with the 10% hypochloride acid. When the metal phosphide is copper phosphide, it is preferred to employ dilute nitric acid (20–30% by volume) at room temperature. Hot, concentrated nitric acid is avoided because while it will remove the metal phosphide effectively, it also dissloves copper. The dilute nitric acid generally requires 7 to 15 minutes to remove the copper phosphide. This time can be reduced to 30 seconds when the acid is first allowed to react with copper. As a result of the third treatment step, the substrate contains a resist-covered metal phosphide over the areas which will be conductive in the final product.

The fourth treatment step of this process comprises dissolving the resist. The dissolving agent is selected so that it will not react with the remaining metal phosphide. Among the various agents which can be used for this purpose are the halogenated hydrocarbons and halocarbons such as chloroform, methyl chloroform, phenyl chloroform, dichlorethylene, trichloroethylene, perchloroethylene, trichloroethane, dichloropropane, ethyl dibromide, ethyl chlorobromide, propylene dibromide, monochlorobenzene, monochlorotoluene and the like; aromatic hydrocarbons such as benzene, toluene, xylene, ethyl benzene, naphthalene and the like. The preferred dissolving agent is trichloroethylene. The thus-treated substrate contains a metal phosphide over the areas which are to be conductive.

Before depositing metal on the designed substrate, it is often advantageous to remove the residual dissolving agent. This can be accomplished by washing the substrate with aqueous or 100% dimethyl formamide; alcohol such as isopropyl and butyl; alcohol-dimethyl formamide mixtures; hot water; detergent-water mixtures; and the like.

The designed substrate can be stored for later use or subjected to a process that has become known in the art as electroless plating or chemical plating. In a typical electroless plating process, a plastic surface is contacted with a solution of a metal salt under conditions in which the metallic ion of the metal salt is reduced to the metallic state and deposited on the plastic surface. The use of the electroless process with the products of this invention relies on the metal phosphide to activate the reduction process.

The designed substrate can also be electroplated by processes known in the art. The treated article is generally used as the cathode. The metal desired to be plated is generally dissolved in an aqueous plating bath, although other media can be employed. Generally, a soluble metal anode of the metal to be plated can be employed. In some instances, however, a carbon anode or other inert anode is used. Suitable metals, solutions and conditions for electroplating are described in Metal Finishing Guidebook Directory for 1967, published by Metals and Plastics Publications, Inc., Westwood, N.J.

All surfaces of the substrate cable treated at the same time by the process of this invention. It is also possible to produce what is known in the art as through connections or through-hole connections. This is accomplished by drilling or punching holes in the substrate corresponding to the desired through connections. However, it is not necessary to obtain a smooth surface on the hole walls. Thereafter, the substrate is treated by the preferred process of this invention, resulting in a metal phosphide design on the surface and a metal phosphide on the hole walls. Subsequent electroless or electroytic treatment will deposit metal on all portions of the metal phosphide.

The preferred process can be modified to include a negative resist treatment. Herein the resist is applied in a negative or reverse pattern, i.e., over the areas which are not to be conductive, followed by the electrodeposition or electroless deposition of metal on the exposed metal phosphide. The resist is removed and then the resulting exposed metal phosphide is removed.

A further modification of the invention comprises applying a resist in a negative pattern, providing the substrate with a metal phosphide as described in the first teratment step of the preferred process, and thereafter either removing the resist and subjecting the substrate to electroless and/or electrolytic plating or subjecting the substrate to electroless and/or electrolytic plating and thereafter removing the resist.

The following examples serve to illustrate the invention but are not intended to limit it. Unless specified otherwise, all temperatures are in degrees centigrade and all parts are understood to be expressed in parts by weight.

Example 1

A polypropylene sheet was immersed in a 2% solution of phosphorus in trichlorethylene at 60° C. for 3 minutes and then washed with a 60% solution of DMF in water at 50° C. for 30 seconds. The sheet was then placed in a two-liter nickel bath which contained 1950 cc. of 2% $NiCl_2$ in 23% $NH_4OH$ and 50 cc. of 20% NaOH. After 10 minutes the sheet was withdrawn and was found to have obtained a highly conductive black nickel phosphide coating. The immersion in the nickel bath was done at room temperature.

Example 2

An ABS plastic sample was treated as in Example 1 except that a 1% solution of phosphorus in a mixture of trichloroethylene and perchloroethylene was employed and the time of immersion in the phosphorus solution was 2 minutes. An excellent quality black coating was produced on the sample.

Example 3

Specimens of polyethylene, polystyrene, polyvinylchloride and polymethylmethacrylate were treated with phosphorus vapor by suspending the plastic specimen for 1 hour in an atmosphere of phosphorus vapor maintained at 100° C. Subsequently, the phosphorus-treated plastic specimens were immersed for 10 minutes in a solution prepared by adding sufficient ammonium hydroxide to a silver nitrate solution to form the complex $AgNO_3.6NH_3$. The treatment resulted in the formation of a silver phosphide deposit at the plastic surface.

Example 4

Samples of cardboard, cork, porous clay, and asbestos cement were subjected to a 2% solution of phosphorus in trichloroethylene at 60° C. and then to a 10% solution of nickel sulfate in excess ammonium hydroxide at 90% C. to form a nickel phosphide at the surface of the substrates.

Example 5

A specimen of polyethylene was immersed in a solution of yellow phosphorus dissolved in trichloroethylene for 1 minute. The resulting phosphorus-treated polyethylene specimen was thereafter immersed in an aqueous solution of copper sulfate for several minutes. The treated polyethylene specimen was washed with water, wiped dry and then dried with hot air. The resulting film of copper phosphide was found to be conductive.

Example 6

A polypropylene substrate provided with a copper phosphide as in Example 5 was printed with a photo resist (KPR manufactured by Kodak) in a design (pattern) corresponding to a printed circuit. The substrate was then subjected for 5 minutes to 50% by volume nitric acid and water maintained at 30° C. to dissolve the unprotected copper phosphide. The thus-treated substrate was immersed in trichloroethylene at 78° C. for 10 minutes to dissolve the resist. The resulting substrate had an adherent printed circuit configuration of copper phosphide on its surface. Thereafter, wires were adherently bound to the copper phosphide by soldering.

Example 7

Specimens of polyvinylchloride-polypropylene copolymer were washed with trichloroethylene for 2 minutes at 65° C. and air-dried at room temperature for 1 minute. The samples were then immersed in a bath containing a 2% solution of phosphorus in trichloroethylene and an equal volume of water. The specimens remained 8 minutes in the phosphorus-trichloroethylene layer at 55° C. and 3 minutes in the water layer at 65° C. before being subjected to DMF maintained at room temperature for 6 minutes. The thus-treated specimens were immersed for 20 minutes in an ammonical solution of nickel sulfate maintained at 65° C. The resulting specimens had a high-gloss black nickel phosphide conductive coating on their surface and a design was printed on their surface with a photo resist. The specimens were subjected to a 50% by volume nitric acid and water solution maintained at 30° C. for 5 minutes. Thereafter, the treated specimens were immersed in trichloroethylene at 78° C. for 10 minutes. The resulting specimens had an adherent nickel phosphide design on their surface.

Example 8

A sample of polypropylene was treated as described in Example 7 to form a nickel phosphide pattern which can be characterized as having fine grooves, i.e., fine, sharply defined areas which were not conductive between the nickel phosphide areas of the sample. The sample was thereafter subjected to an electroless nickel plating bath and chromate passivation. The sample was then electroplated with ductile nickel to a thickness of 4 mils. The ductile nickel layer was separated from the original printed design to produce a replica of the pattern on the electroformed material.

Various changes and modifications other than those described hereinabove can be made in the process and products of this invention without departing from the spirit and scope of the invention. The various embodiments of the invention disclosed herein serve to further illustrate the invention but are not intended to limit it.

I claim:

1. A process for forming a design on a non-metallic substrate which comprises contacting the substrate with white phosphorus and thereafter subjecting the substrate to a solution of a metal salt or complex thereof so as to form a metal phosphide, wherein said metal is selected from Groups I–B, II–B, IV–B, V–B, VI–B, VII–B and VIII of the Periodic Table; applying a resist to a portion of the metal phosphide coated substrate; removing the unprotected metal phosphide from the substrate; dissolving the resist; and thereafter treating the substrate with a metal plating solution.

2. The process of claim 1 wherein the unprotected metal phosphide is removed by an oxidizing medium.

3. The process of claim 2 wherein said oxidizing medium is about 50 percent by volume solution of nitric acid.

4. The process of claim 3 wherein the metal is nickel and the substrate is a plastic.

5. The process wherein the substrate resulting from the process of claim 4 is electroplated.

6. An article produced by the process of claim 1.

7. A process for forming a design on a non-metallic substrate which comprises applying a resist to a portion of metal phosphide provided at the surface of a substrate wherein said metal is selected from Groups I–B, II–B, IV–B, V–B, VI–B, VII–B and VIII of the Periodic Table; removing the unprotected metal phosphide; dissolving the resist; and thereafter treating the substrate with a metal plating solution, wherein the metal phosphide has been provided at the surface of the substrate by a process which comprises subjecting the substrate to white phosphorus and thereafter subjecting the thus treated substrate to a solution of a metal salt or complex thereof, wherein said metal is selected from Groups I–B, II–B, IV–B, V–B, VI–B, VII–B and VIII of the Periodic Table.

8. The process of claim 7 wherein the unprotected metal phosphide is removed by an oxidizing medium.

9. The process of claim 8 wherein the oxidizing medium is about 50 percent by volume solution of nitric acid.

10. The process wherein the treated substrate resulting from the process of claim 7 is electroplated.

11. The process of claim 10 wherein the metal is nickel and the substrate is a plastic.

12. An article produced by the process of claim 7.

13. A process for forming a design which comprises subjecting a substrate to white phosphorus; subjecting the thus treated substrate to a solution of a metal salt or complex thereof so as to form a metal phosphide wherein said metal is selected from Groups I–B, II–B, IV–B, V–B, VI–B, VII–B and VIII of the Periodic Table; applying a resist to a portion of the metal phosphide; depositing, from a metal plating solution, metal on the exposed metal phosphide; removing the resist; and removing the thus exposed metal phosphide.

14. An article produced by the process of claim 13.

15. A process for forming a design which comprises applying a resist to a portion of a substrate; subjecting the substrate to white phosphorus; subjecting the substrate to a solution of a metal salt or complex thereof so as to form a metal phosphide wherein said metal is selected from Groups I–B, II–B, IV–B, V–B, VI–B, VII–B and VIII of the Periodic Table; depositing, from a metal plating solution, metal on the metal phosphide; and removing the resist.

16. An article produced by the process of claim 15.

References Cited

UNITED STATES PATENTS

| | | | |
|---|---|---|---|
| 3,424,597 | 1/1969 | Shipley Jr. | 117—160 X |
| 3,306,830 | 2/1967 | Bittrich et al. | 117—160 X |
| 3,269,861 | 8/1967 | Schveble, Jr. et al. | 117—212 |
| 3,152,938 | 10/1964 | Osefchin et al. | 96—36.2 X |
| 2,690,401 | 9/1954 | Gutzeit et al. | 117—160 X |

OTHER REFERENCES

Miller, J. W.: "A Comprehensive Treatise on Inorganic Theoretical Chemistry," vol. III, p. 317 (1928).

Bayard, J.: "Electrodeposition on Plastic Materials" in Metal Industry, May 1940, pp. 255–256, 259.

ALFRED L. LEAVITT, Primary Examiner

A. GRIMALDI, Assistant Examiner

U.S. Cl. X.R.

96—36.2; 117—45, 47 A, 212

PO-1050
(5/69)

UNITED STATES PATENT OFFICE
CERTIFICATE OF CORRECTION

Patent No. 3,625,730 Dated December 7, 1971

Inventor(s) Sung Ki Lee

It is certified that error appears in the above-identified patent and that said Letters Patent are hereby corrected as shown below:

Column 1, line 64, "substantially non-metalilc" should read ---substantially non-metallic---. Column 2, line 66, "isbutyl" should read ---isobutyl---. Column 3, line 31, "and and" should read ---and an---; line 36, "Kodex" should read ---Kydex---; line 49, "No. 671,331, filed September 28, 1967, now patent No. 3,508,754", should read ---SN 671,337, filed September 28, 1967, now abandoned---. Column 4, line 5, "amine" should read ---amines---; line 73, "dichlorethylene" should read ---dichloroethylene---. Column 5, line 35, "cable" should read ---can be---; line 57, "teratment" should read ---treatment---; line 69, "trichlorethylene: should read ---trichloroethylene---. Column 6, lines 27 and 28, "90% C" should read ---90°C---.

Signed and sealed this 27th day of June 1972.

(SEAL)
Attest:

EDWARD M.FLETCHER,JR.
Attesting Officer

ROBERT GOTTSCHALK
Commissioner of Patents